United States Patent
Leidholm et al.

(10) Patent No.: US 8,541,048 B1
(45) Date of Patent: Sep. 24, 2013

(54) FORMATION OF PHOTOVOLTAIC ABSORBER LAYERS ON FOIL SUBSTRATES

(75) Inventors: Craig Leidholm, Sunnyvale, CA (US); Brent Bollman, San Jose, CA (US)

(73) Assignee: Nanosolar, Inc., San Jose, CA (US)

( * ) Notice: Subject to any disclaimer, the term of this patent is extended or adjusted under 35 U.S.C. 154(b) by 569 days.

(21) Appl. No.: 12/437,539

(22) Filed: May 7, 2009

Related U.S. Application Data

(63) Continuation-in-part of application No. 12/060,221, filed on Mar. 31, 2008, and a continuation-in-part of application No. 10/943,685, filed on Sep. 18, 2004.

(60) Provisional application No. 60/909,357, filed on Mar. 30, 2007, provisional application No. 60/911,259, filed on Apr. 11, 2007.

(51) Int. Cl.
*B05D 5/12* (2006.01)
*H01L 21/00* (2006.01)
*H01L 21/06* (2006.01)
*H01L 27/14* (2006.01)
*H01L 31/00* (2006.01)

(52) U.S. Cl.
USPC .......... 427/76; 427/58; 427/74; 427/123; 438/84; 438/102; 257/431; 257/E31.001

(58) Field of Classification Search
None
See application file for complete search history.

(56) References Cited

U.S. PATENT DOCUMENTS

| | | |
|---|---|---|
| 3,423,301 A | 1/1969 | Stearns |
| 3,586,541 A | 6/1971 | Chamberlin |
| 3,966,568 A | 6/1976 | Crossley et al. |
| 4,191,794 A | 3/1980 | Biter et al. |
| 4,192,721 A | 3/1980 | Fawcett et al. |
| 4,404,422 A | 9/1983 | Green et al. |
| 4,522,663 A | 6/1985 | Ovshinsky et al. |
| 4,536,607 A | 8/1985 | Wiesmann |
| 4,622,432 A | 11/1986 | Yamazaki |
| 4,642,140 A | 2/1987 | Noufi et al. |
| 4,677,250 A | 6/1987 | Barnett et al. |

(Continued)

FOREIGN PATENT DOCUMENTS

| | | |
|---|---|---|
| DE | 2741954 A | 3/1979 |
| EP | 793277 A | 9/1997 |

(Continued)

OTHER PUBLICATIONS

Bremaud et al., Flexible Cu(In,Ga)Se2 on Al foils and the effects of Al during chemical bath deposition, Thin Solid Films, 515, Dec. 16, 2006, pp. 5857-5861.*

(Continued)

*Primary Examiner* — Christina Johnson
*Assistant Examiner* — Benjamin Schiffman
(74) *Attorney, Agent, or Firm* — Joshua D. Isenberg; JDI Patent

(57) ABSTRACT

An absorber layer of a photovoltaic device may be formed on an aluminum or metallized polymer foil substrate. A nascent absorber layer containing one or more elements of group IB and one or more elements of group IIIA is formed on the substrate. The nascent absorber layer and/or substrate is then rapidly heated from an ambient temperature to an average plateau temperature range of between about 200° C. and about 600° C. and maintained in the average plateau temperature range 1 to 30 minutes after which the temperature is reduced.

18 Claims, 1 Drawing Sheet

(56) References Cited

U.S. PATENT DOCUMENTS

| | | | |
|---|---|---|---|
| 4,806,436 A | 2/1989 | Tada et al. | |
| 4,914,276 A * | 4/1990 | Blair | 219/390 |
| 4,940,604 A | 7/1990 | Suyama et al. | |
| 5,045,409 A | 9/1991 | Eberspacher et al. | |
| 5,078,804 A | 1/1992 | Chen et al. | |
| 5,093,453 A | 3/1992 | St. Clair et al. | |
| 5,141,564 A | 8/1992 | Chen et al. | |
| 5,244,509 A | 9/1993 | Arao et al. | |
| 5,277,786 A | 1/1994 | Kawakami | |
| 5,286,306 A | 2/1994 | Menezes | |
| 5,356,839 A | 10/1994 | Tuttle et al. | |
| 5,401,573 A | 3/1995 | Babel et al. | |
| 5,419,781 A | 5/1995 | Hamakawa et al. | |
| 5,436,204 A * | 7/1995 | Albin et al. | 438/488 |
| 5,441,897 A | 8/1995 | Noufi et al. | |
| 5,445,847 A | 8/1995 | Wada et al. | |
| 5,538,903 A | 7/1996 | Aramoto et al. | |
| 5,578,503 A | 11/1996 | Karg et al. | |
| 5,626,688 A | 5/1997 | Probst et al. | |
| 5,633,033 A | 5/1997 | Nishitani et al. | |
| 5,677,250 A | 10/1997 | Knapp | |
| 5,728,231 A | 3/1998 | Negami et al. | |
| 5,730,852 A | 3/1998 | Bhattacharya et al. | |
| 5,925,228 A | 7/1999 | Panitz et al. | |
| 5,985,691 A * | 11/1999 | Basol et al. | 438/95 |
| 5,994,163 A | 11/1999 | Bodegard et al. | |
| 6,072,117 A * | 6/2000 | Matsuyama et al. | 136/256 |
| 6,107,562 A | 8/2000 | Hashimoto et al. | |
| 6,121,541 A | 9/2000 | Arya | |
| 6,124,039 A | 9/2000 | Goetz et al. | |
| 6,127,202 A | 10/2000 | Kapur et al. | |
| 6,268,014 B1 | 7/2001 | Eberspacher et al. | |
| 6,372,538 B1 | 4/2002 | Wendt et al. | |
| 6,429,369 B1 * | 8/2002 | Tober et al. | 136/265 |
| 6,974,976 B2 | 12/2005 | Hollars | |
| 7,053,294 B2 * | 5/2006 | Tuttle et al. | 136/265 |
| 7,091,136 B2 * | 8/2006 | Basol | 438/765 |
| 7,521,344 B2 * | 4/2009 | Basol | 438/584 |
| 2004/0144419 A1 | 7/2004 | Fix et al. | |
| 2004/0219730 A1 | 11/2004 | Basol | |
| 2005/0074915 A1 * | 4/2005 | Tuttle et al. | 438/57 |
| 2005/0183767 A1 | 8/2005 | Yu et al. | |
| 2005/0186342 A1 | 8/2005 | Sager et al. | |
| 2006/0062902 A1 | 3/2006 | Sager et al. | |
| 2006/0165911 A1 * | 7/2006 | Basol | 427/458 |
| 2006/0189155 A1 * | 8/2006 | Basol | 438/765 |

FOREIGN PATENT DOCUMENTS

| | | |
|---|---|---|
| JP | 63249379 A | 10/1988 |
| JP | 6289369 A | 10/1994 |
| WO | 02084708 A | 10/2002 |
| WO | 03007386 A1 | 1/2003 |
| WO | WO 03007386 A1 * | 1/2003 |

OTHER PUBLICATIONS

Hartmann et al., "Flexible and Light Weight Substrates for CU(In,GA)Se2 Solar Cells and Modules", Sep. 15-22, 2000, Conference Record of the twenty-Eighth IEEE Photovoltaic Specialists Conference, pp. 638-641.
Office Action dated Aug. 17, 2012 for U.S. Appl. No. 12/060,221.
Office Action dated Dec. 8, 2009 for U.S. Appl. No. 12/060,221.
Office Action dated Jan. 3, 2007 for U.S. Appl. No. 10/943,685.
Office Action dated Jan. 18, 2011 for U.S. Appl. No. 10/943,685.
Office Action dated Jan. 24, 2006 for U.S. Appl. No. 10/943,685.
Office Action dated Jul. 17, 2008 for U.S. Appl. No. 10/943,685.
Office Action dated Sep. 2, 2011 for U.S. Appl. No. 10/943,685.
S. Wiedeman et al. "CIGS Processing on a Flexible Polyimide Substrates." Proc. 2001 NCPV Program Review Meeting, p. 49-50 (2001).
U.S. Appl. No. 10/782,017, filed Feb. 19, 2004.
U.S. Appl. No. 10/943,658, filed Sep. 18, 2004.

* cited by examiner

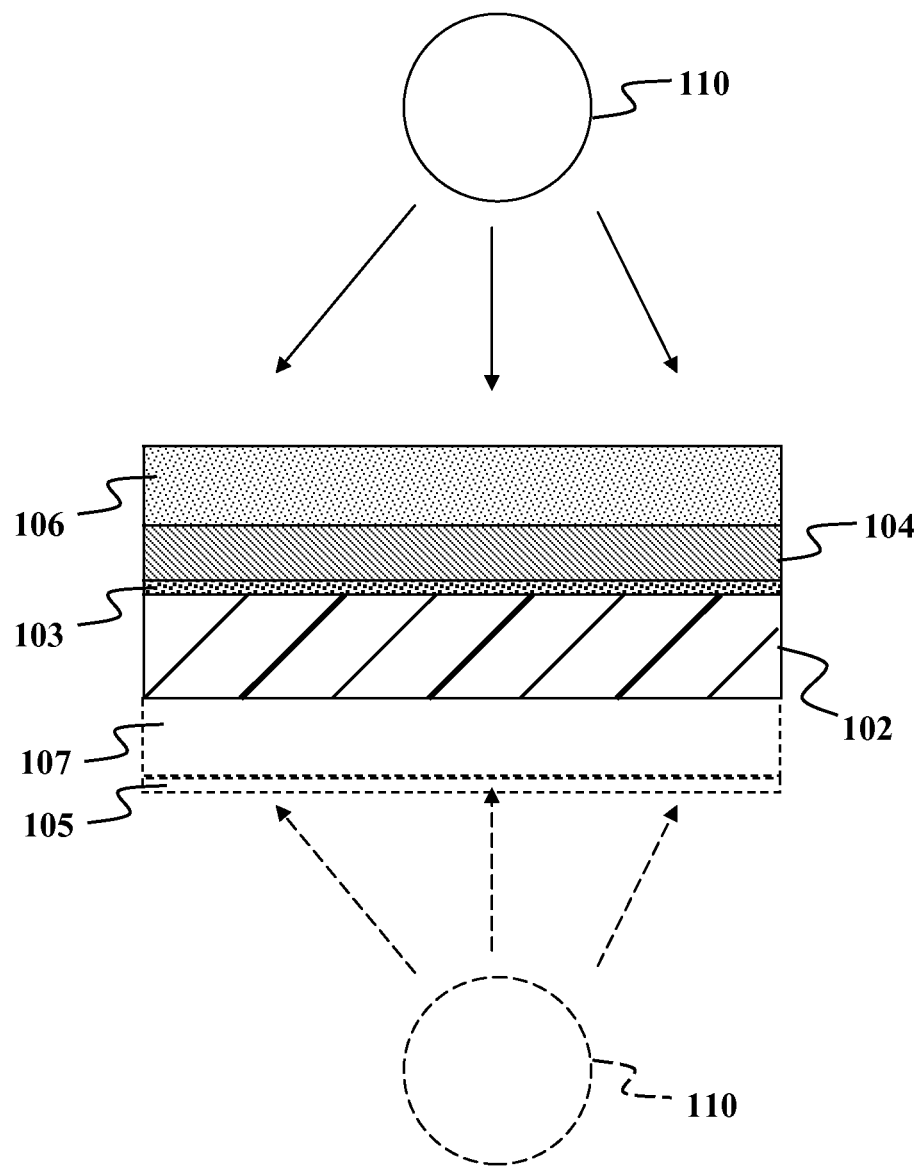

FORMATION OF PHOTOVOLTAIC ABSORBER LAYERS ON FOIL SUBSTRATES

CROSS-REFERENCE TO RELATED APPLICATION

This application is a continuation-in-part of U.S. patent application Ser. No. 12/060,221 filed Mar. 31, 2008 which claims the benefit of priority to U.S. Provisional Application Ser. No. 60/909,357 filed Mar. 30, 2007 and U.S. Provisional Application Ser. No. 60/911,259 filed Apr. 11, 2007. This application is a continuation-in-part of U.S. patent application Ser. No. 10/943,685 filed Sep. 18, 2004. The entire disclosures of all the foregoing applications are fully incorporated herein by reference for all purposes.

FIELD OF THE INVENTION

The present invention relates to fabrication of photovoltaic devices and more specifically to processing and annealing of absorber layers for photovoltaic devices.

BACKGROUND OF THE INVENTION

Efficient photovoltaic devices, such as solar cells, have been fabricated using absorber layers made with alloys containing elements of group IB, IIIA and VIA, e.g., alloys of copper with indium and/or gallium or aluminum and selenium and/or sulfur. Such absorber layers are often referred to as CIGS layers and the resulting devices are often referred to as CIGS solar cells. The CIGS absorber layer may be deposited on a substrate. It would be desirable to fabricate such an absorber layer on an aluminum foil substrate because Aluminum foil is relatively inexpensive, lightweight, and flexible. Unfortunately, current techniques for depositing CIGS absorber layers are incompatible with the use of aluminum foil as a substrate.

Typical deposition techniques include evaporation, sputtering, chemical vapor deposition, and the like. These deposition processes are typically carried out at high temperatures and for extended times. Both factors can result in damage to the substrate upon which deposition is occurring. Such damage can arise directly from changes in the substrate material upon exposure to heat, and/or from undesirable chemical reactions driven by the heat of the deposition process. Thus very robust substrate materials are typically required for fabrication of CIGS solar cells. These limitations have excluded the use of aluminum and aluminum-foil based foils.

An alternative deposition approach is the solution-based printing of the CIGS precursor materials onto a substrate. Examples of solution-based printing techniques are described, e.g., in Published PCT Application WO 2002/084708 and commonly-assigned U.S. patent application Ser. No. 10/782,017, both of which are incorporated herein by reference. Advantages to this deposition approach include both the relatively lower deposition temperature and the rapidity of the deposition process. Both advantages serve to minimize the potential for heat-induced damage of the substrate on which the deposit is being formed.

Although solution deposition is a relatively low temperature step in fabrication of CIGS solar cells, it is not the only step. In addition to the deposition, a key step in the fabrication of CIGS solar cells is the selenization and annealing of the CIGS absorber layer. Selenization introduces selenium into the bulk CIG or CI absorber layer, where the element incorporates into the film, while the annealing provides the absorber layer with the proper crystalline structure. In the prior art, selenization and annealing has been performed by heating the substrate in the presence of $H_2Se$ or Se vapor and keeping this nascent absorber layer at high temperatures for long periods of time.

While use of aluminum (Al) as a substrate for solar cell devices would be desirable due to both the low cost and lightweight nature of such a substrate, conventional techniques that effectively anneal the CIGS absorber layer also heat the substrate to high temperatures, resulting in damage to Al substrates. There are several factors that result in Al substrate degradation upon extended exposure to heat and/or selenium-containing compounds for extended times. First, upon extended heating, the discrete layers within a Mo-coated Al substrate can fuse and form an intermetallic back contact for the device, which decreases the intended electronic functionality of the Mo-layer. Second, the interfacial morphology of the Mo layer is altered during heating, which can negatively affect subsequent CIGS grain growth through changes in the nucleation patterns that arise on the Mo layer surface. Third, upon extended heating, Al can migrate into the CIGS absorber layer, disrupting the function of the semiconductor. Fourth, the impurities that are typically present in the Al foil (e.g. Si, Fe, Mn, Ti, Zn, and V) can travel along with mobile Al that diffuses into the solar cell upon extended heating, which can disrupt both the electronic and optoelectronic function of the cell. Fifth, when Se is exposed to Al for relatively long times and at relatively high temperatures, aluminum selenide can form, which is unstable. In moist air the aluminum selenide can react with water vapor to form aluminum oxide and hydrogen selenide. Hydrogen selenide is a highly toxic gas, whose free formation can pose a safety hazard. For all these reasons, high-temperature deposition, annealing, and selenization are therefore impractical for substrates made of aluminum or aluminum alloys.

Because of the high-temperature, long-duration deposition and annealing steps, CIGS solar cells cannot be effectively fabricated on aluminum substrates (e.g. flexible foils comprised of Al and/or Al-based alloys) and instead must be fabricated on heavier substrates made of more robust (and more expensive) materials, such as stainless steel, titanium, or molybdenum foils, glass substrates, or metal- or metal-oxide coated glass. Thus, even though CIGS solar cells based on aluminum foils would be more lightweight, flexible, and inexpensive than stainless steel, titanium, or molybdenum foils, glass substrates, or metal- or metal-oxide coated glass substrates, current practice does not permit aluminum foil to be used as a substrate.

Thus, there is a need in the art, for a method for fabricating CIGS solar cells on aluminum substrates.

SUMMARY OF THE INVENTION

Embodiments of the present invention address at least some of the drawbacks set forth above. It should be understood that at least some embodiments of the present invention may be applicable use with various types of photovoltaic absorbers. Embodiments of the present invention may be adaptable for roll-to-roll and/or batch manufacturing processes. At least some of these and other objectives described herein will be met by various embodiments of the present invention.

In one embodiment of the present invention, a method is provided comprising continuous processing of an elongate flexible metal substrate coated with a nascent absorber layer, the continuous processing occurring as the substrate passes through an elongate furnace in a non-oxygen group VIA vapor atmosphere to incorporate the group VIA element into the nascent absorber layer without damaging or destroying the metal substrate and without generating substantial hydrogen selenide.

Optionally, the nascent absorber layer and/or substrate passing through the elongate furnace is: a) rapidly heated from an ambient temperature to a plateau temperature range of between about 200° C. and about 600° C., the rapid thermal heating occurring at a ramp rate between about 5 C.°/sec and about 15° C.°/sec, b) maintained at the plateau temperature for between about 2 minutes and 10 minutes; and c) lowered to a reduced temperature. Optionally, the substrate is moved using a roll-to-roll system.

In another embodiment of the present invention, a method is provided comprising continuous processing of an elongate flexible metal substrate coated with a nascent absorber layer in two or more processing stages, the processing occurring as the substrate passes through an elongate furnace, wherein at least one of the foregoing stages occurs in a non-oxygen group VIA vapor and a total time spent above ambient temperature in such vapor is sufficient to incorporate the non-oxygen group VIA material into the absorber layer without damaging or destroying the metal substrate while continuously moving the substrate through the furnace.

Optionally, the nascent absorber layer and/or substrate passing through the elongate furnace is at one stage rapidly heated from an ambient temperature to a plateau temperature range of between about 200° C. and about 600° C., the rapid thermal heating occurring at a ramp rate between about 5 C.°/sec and about 15° C.°/sec, at another stage maintained at the plateau temperature for between about 2 minutes and 10 minutes; and at yet another stage lowered to a reduced temperature. Optionally, the substrate is moved using a roll-to-roll system.

A further understanding of the nature and advantages of the invention will become apparent by reference to the remaining portions of the specification and drawings.

BRIEF DESCRIPTION OF THE DRAWINGS

The teachings of the present invention can be readily understood by considering the following detailed description in conjunction with the accompanying drawings, in which:

FIG. 1 is a cross-sectional schematic diagram illustrating fabrication of an absorber layer according to an embodiment of the present invention.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention allow fabrication of CIGS absorber layers on aluminum foil substrates. The invention lends itself to several variants (which remain, however, optional) used as alternatives or in combination. According to embodiments of the present invention, a nascent absorber layer containing elements of group IB and IIIA formed on an aluminum substrate by solution deposition may be annealed by rapid heating from an ambient temperature to a plateau temperature range of between about 200° C. and about 600° C. The temperature is maintained in the plateau range for between about 2 minutes and about 15 minutes, and subsequently reduced. Alternatively, the annealing temperature could be modulated to oscillate within a temperature range without being maintained at a particular plateau temperature.

FIG. 1 depicts a partially fabricated photovoltaic device 100, and a rapid heating unit 110 the device generally includes a substrate 102, an optional base electrode 104, and a nascent absorber layer 106. By way of non-limiting example, the substrate 102 may be made of a metal such as aluminum. In other embodiments, metals such as, but not limited to, stainless steel, molybdenum, titanium, copper, metallized plastic films, or combinations of the foregoing may be used as the substrate 102. Alternative substrates include but are not limited to ceramics, glasses, and the like. Any of these substrates may be in the form of foils, sheets, rolls, the like, or combinations thereof. Depending on the conditions of the surface, and material of the substrate, it may be useful to clean and/or smoothen the substrate surface. The aluminum foil substrate 102 may be approximately 5 microns to one hundred or more microns thick and of any suitable width and length. The aluminum foil substrate 102 may be made of aluminum or an aluminum-based alloy. Alternatively, the foil substrate 102 may be made by metallizing a polymer foil substrate, where the polymer is selected from the group of polyesters, polyethylene naphtalates, polyetherimides, polyethersulfones, polyetheretherketones, polyimides, and/or combinations of the above. By way of example, the substrate 102 may be in the form of a long sheet of aluminum foil suitable for processing in a roll-to-roll system. The base electrode 104 is made of an electrically conducive material compatible with processing of the nascent absorber layer 106. By way of example, the base electrode 104 may be a layer of molybdenum, e.g., about 0.1 to 5 microns thick, and optionally from about 0.1 to 1.0 microns thick. Optionally, in other embodiments, the base electrode 104 may be substantially thinner such as in the range of about 5 nm to about 100 nm, optionally 10 nm to 50 nm. These thinner electrodes 104 may be used with thicker layers of barrier layers 103. The base electrode layer may be deposited by sputtering or evaporation or, alternatively, by chemical vapor deposition (CVD), atomic layer deposition (ALD), sol-gel coating, electroplating and the like.

Aluminum has properties that vary based on the physical form that it is in. For example aluminum deposited on glass versus an aluminum foil may have significantly different properties. At a macro-scale level, metal on glass has a small surface area/non-scaleable form versus the large surface area of a metal foil. At a micro-scale level, metal on glass has a rigid/inelastic quality versus metal foil which is typically flexible and elastic. Metal on glass has lower chemical reactivity and thus no need for a fast RTP processing. Metal foil on the other hand has high chemical reactivity and thus fast RTP is required with a ramp rate and throughput that is non-damaging to the metal foil. The metal on glass embodiments are typically pure as they are sputtered onto the glass surface. Metal in foil form typically includes much higher levels of impurities simply due to the nature of processing the metal into foil form. Aside from impurities in the bulk material, there are also impurities introduced during foil creation such as oils and/or inclusions related to the rolling and/or pressing processes used to create such foils. At a nano-scale level, the surface of a metal on glass embodiment typically provides an atomically flat surface. By contrast, the surface of a metal foil typically provides an atomically rough surface. Thus, although there are many advantages of metal foils, they also present challenges not found or contemplated for metal on glass embodiments. Additional details regarding aluminum can be found in the *Handbook of Aluminum*, Vol. 1, Physical Metallurgy and Processes©2003 edited by George E. Totten and D. Scott Mackenzie and chapters 2, 3, 5-7, 19, 20, and 22 are fully incorporated herein by reference for all purposes. Additionally, more teachings can be found in chapters 1 and 4 of *Physical Foundations of Materials Science* by G. Gottstein© 2004, fully incorporated herein by reference for all purposes.

It should be understood that the electrical conductivity of aluminum strongly depends on a nature and quantity of impurities present. By way of nonlimiting example, impurities having increasingly negative influence on electrical conductivity can be arranged in the following order: Cr, V, Mn, Ti, Mg, Ag, Cu, Zn, Si, Fe, and Ni. In one embodiment, the main impurities in aluminum are Si, Fe, Cu, Zn, and Ti. At the contents of Si up to 0.006% the value the ratio Fe/Si (from 0.8 up to 3.8) affects slightly the electrical resistivity. Increasing Si content up to 0.15-0.16% will alter things. Additionally, impurities such as Cr, V, Mn, Ti influence most negatively on electrical resistivity of aluminum. In one embodiment, aluminum intended for good electrical conductivity may be configured so that Cr+V+Mn+Ti has level of about 0.015% or less. Optionally, that amount is 0.010% or less with the content of silicon between about 0.12% and 0.16%.

Aluminum and molybdenum can and often do inter-diffuse into one another, with deleterious electronic and/or optoelectronic effects on the device 100. To inhibit such inter-diffusion, an intermediate, interfacial layer 103 may be incorporated between the aluminum foil substrate 102 and molybdenum base electrode 104. The interfacial layer may be composed of any of a variety of materials, including but not limited to chromium, vanadium, tungsten, and glass, or compounds such as nitrides (including but not limited to titanium nitride, tantalum nitride, tungsten nitride, hafnium nitride, niobium nitride, zirconium nitride, vanadium nitride, silicon nitride, and/or molybdenum nitride), oxynitrides (including but not limited to oxynitrides of Ti, Ta, V, W, Si, Zr, Nb, Hf, or Mo), oxides (including but not limited to oxides of Ti, Ta, V, W, Si, Zr, Nb, Hf, or Mo), and/or carbides (including but not limited to carbides of Ti, Ta, V, W, Si, Zr, Nb, Hf, or Mo). In one embodiment, the materials selected from the aforementioned may be those that are electrically conductive diffusion barriers. The thickness of this layer can range from 10 nm to 50 nm or from 10 nm to 30 nm. Optionally, the thickness may be in the range of about 50 nm to about 1000 nm. Optionally, the thickness may be in the range of about 100 nm to about 750 nm. Optionally, the thickness may be in the range of about 100 nm to about 500 nm. Optionally, the thickness may be in the range of about 110 nm to about 300 nm. In one embodiment, the thickness of the layer 103 is at least 100 nm or more. In another embodiment, the thickness of the layer 103 is at least 150 nm or more. In one embodiment, the thickness of the layer 103 is at least 200 nm or more.

Aluminum and molybdenum can and often do inter-diffuse into one another, with deleterious electronic and/or optoelectronic effects on the device 100. To inhibit such inter-diffusion, an intermediate, interfacial layer 103 may be incorporated between the aluminum foil substrate 102 and molybdenum base electrode 104. The interfacial layer may be composed of any of a variety of materials, including but not limited to chromium, vanadium, tungsten, and glass, or compounds such as nitrides (including but not limited to titanium nitride, tantalum nitride, tungsten nitride, hafnium nitride, niobium nitride, zirconium nitride vanadium nitride, silicon nitride, or molybdenum nitride), oxynitrides (including but not limited to oxynitrides of Ti, Ta, V, W, Si, Zr, Nb, Hf, or Mo), oxides, and/or carbides. The material may be selected to be an electrically conductive material. In one embodiment, the materials selected from the aforementioned may be those that are electrically conductive diffusion barriers. The thickness of this layer can range from 10 nm to 50 nm or from 10 nm to 30 nm. Optionally, the thickness may be in the range of about 50 nm to about 1000 nm. Optionally, the thickness may be in the range of about 100 nm to about 750 nm. Optionally, the thickness may be in the range of about 100 nm to about 500 nm. Optionally, the thickness may be in the range of about 110 nm to about 300 nm. In one embodiment, the thickness of the layer 103 is at least 100 nm or more. In another embodiment, the thickness of the layer 103 is at least 150 nm or more. In one embodiment, the thickness of the layer 103 is at least 200 nm or more. Some embodiments may use two or more layers 103 of different materials, such as but not limited to two nitrides, a nitride/a carbide, or other combinations of the foregoing materials, wherein one layer may be selected to improve backside reflectivity.

Optionally, some embodiments may include another layer such as but not limited to an aluminum layer above the layer 103 and below the base electrode layer 104. Optionally, instead of Al, this layer may be comprised of one or more of the following: Cr, Ti, Ta, V, W, Si, Zr, Nb, Hf, and/or Mo. This layer may be thicker than the layer 103. Optionally, it may be the same thickness or thinner than the layer 103. The thickness of this layer above the layer 103 and below the base electrode layer 104 can range from 10 nm to 50 nm or from 10 nm to 30 nm. Optionally, the thickness may be in the range of about 50 nm to about 1000 nm. Optionally, the thickness may be in the range of about 100 nm to about 750 nm. Optionally, the thickness may be in the range of about 100 nm to about 500 nm. Optionally, the thickness may be in the range of about 110 nm to about 300 nm.

Optionally, some embodiments may include another layer such as but not limited to an aluminum layer above the substrate 102 and below the barrier layer 103. Optionally, instead of Al, this layer may be comprised of one or more of the following: Cr, Ti, Ta, V, W, Si, Zr, Nb, Hf, and/or Mo. This layer may be thicker than the layer 103. Optionally, it may be the same thickness or thinner than the layer 103. The thickness of this layer above the substrate 102 and below the barrier layer 103 can range from 10 nm to 150 nm, 50 to 100 nm, or from 10 nm to 50 nm. Optionally, the thickness may be in the range of about 50 nm to about 1000 nm. Optionally, the thickness may be in the range of about 100 nm to about 750 nm. Optionally, the thickness may be in the range of about 100 nm to about 500 nm. Optionally, the thickness may be in the range of about 110 nm to about 300 nm.

It should be understood that in some embodiments, this layer 103 may be placed on one or optionally both sides of the aluminum foil (shown as layer 105 in phantom in FIG. 1).

If barrier layers are on both sides of the aluminum foil, it should be understood that the protective layers may be of the same material or they may optionally be different materials from the aforementioned materials. This may be comprised of a material such as but not limited to chromium, vanadium, tungsten, or compounds such as nitrides (including tantalum nitride, tungsten nitride, titanium nitride, silicon nitride, zirconium nitride, and/or hafnium nitride), oxides (including but not limited to $Al_2O_3$ or $SiO_2$), carbides (including SiC), and/or any single or multiple combination of the foregoing. By way of example, the underside layer 103 may be about 0.1 to about 5 microns thick, and optionally from about 0.1 to 1.0 microns thick. Optionally, in other embodiments, the layer may be substantially thinner such as in the range of about 5 nm to about 100 nm. The bottom protective layer 105 may be any of the materials. Optionally, some embodiments may include another layer 107 such as but not limited to an aluminum layer above the layer 105 and below the aluminum foil 102. This layer 107 may be thicker than the layer 103 (or the layer 104). Optionally, it may be the same thickness or thinner than the layer 103 (or the layer 104). Although not limited to the following, this layer 107 may be comprised of one or more of the following: Mo, Cu, Ag, Al, Ta, Ni, Cr, NiCr, or steel. Some embodiments may optionally have more than one layer between the protective layer 105 and the aluminum foil 102. Optionally, the material for the layer 105 may be an electrically insulating material such as but not limited to an oxide, alumina, or similar materials. For any of the embodiments herein, the layer 105 may be used with or without the layer 107.

The nascent absorber layer 106 may include material containing elements of groups IB, IIIA, and (optionally) VIA. Optionally, the absorber layer copper (Cu) is the group IB element, Gallium (Ga) and/or Indium (In) and/or Aluminum may be the group IIIA elements and Selenium (Se) and/or Sulfur (S) as group VIA elements. The group VIA element may be incorporated into the nascent absorber layer 106 when it is initially solution deposited or during subsequent processing to form a final absorber layer from the nascent absorber layer 106. The nascent absorber layer 106 may be about 1000 nm thick when deposited. Subsequent rapid thermal processing and incorporation of group VIA elements may change the morphology of the resulting absorber layer such that it increases in thickness (e.g., to about twice as much as the nascent layer thickness under some circumstances).

Fabrication of the absorber layer on the aluminum foil substrate 102 is relatively straightforward. First, the nascent absorber layer is deposited on the substrate 102 either directly on the aluminum or on an uppermost layer such as the electrode 104. By way of example, and without loss of generality, the nascent absorber layer may be deposited in the form of a film of a solution-based precursor material containing nanoparticles that include one or more elements of groups IB, IIIA and (optionally) VIA. Examples of such films of such solution-based printing techniques are described e.g., in commonly-assigned U.S. patent application Ser. No. 10/782,017, entitled "SOLUTION-BASED FABRICATION OF PHOTOVOLTAIC CELL" and also in PCT Publication WO 02/084708, entitled "METHOD OF FORMING SEMICONDUCTOR COMPOUND FILM FOR FABRICATION OF ELECTRONIC DEVICE AND FILM PRODUCED BY SAME" the disclosures of both of which are incorporated herein by reference.

Alternatively, the nascent absorber layer 106 may be formed by a sequence of atomic layer deposition reactions or any other conventional process normally used for forming such layers. Atomic layer deposition of IB-IIIA-VIA absorber layers is described, e.g., in commonly-assigned, co-pending application Ser. No. 10/943,658 entitled "FORMATION OF CIGS ABSORBER LAYER MATERIALS USING ATOMIC LAYER DEPOSITION AND HIGH THROUGHPUT SURFACE TREATMENT ON COILED FLEXIBLE SUBSTRATES", which has been incorporated herein by reference above.

The nascent absorber layer 106 is then annealed by flash heating it and/or the substrate 102 from an ambient temperature to an average plateau temperature range of between about 200° C. and about 600° C. with the heating unit 110. Optionally, the temperature may be greater than 400° C. Optionally, the temperature may be greater than 500° C. The heating unit 110 optionally provides sufficient heat to rapidly raise the temperature of the nascent absorber layer 106 and/or substrate 102 (or a significant portion thereof) e.g., at between about 5 C.°/sec and about 15° C.°/sec. By way of example, the heating unit 110 may include one or more infrared (IR) lamps that provide sufficient radiant heat. By way of example, 8 IR lamps rated at about 500 watts each situated about ⅛" to about 1" from the surface of the substrate 102 (4 above and 4 below the substrate, all aimed towards the substrate) can provide sufficient radiant heat to process a substrate area of about 25 cm$^2$ per hour in a 4" tube furnace. The lamps may be ramped up in a controlled fashion, e.g., at an average ramp rate of about 10° C.°/sec. Those of skill in the art will be able to devise other types and configurations of heat sources that may be used as the heating unit 110. For example, in a roll-to-roll manufacturing line, heating and other processing can be carried out by use of IR lamps spaced 1" apart along the length of the processing region, with IR lamps equally positioned both above and below the substrate, and where both the IR lamps above and below the substrate are aimed towards the substrate. Alternatively, IR lamps could be placed either only above or only below the substrate 102, and/or in configurations that augment lateral heating from the side of the chamber to the side of the substrate 102. It should be understood, of course, that other heating sources may be used to provide the desired heating ramp rate.

The absorber layer 106 and/or substrate 102 are maintained in the average plateau temperature range for between about 1 minute and about 15 minutes, between about 1 and about 30 minutes. Optionally, the total time including the ramp may be in the range of about 1 to about 5 minutes, about 1 to about 10 minutes, about 1 minute to about 15 minutes, between about 1 and about 30 minutes. For example, the temperature may be maintained in the desired range by reducing the amount of heat from the heating unit 110 to a suitable level. In the example of IR lamps, the heat may be reduced by simply turning off the lamps. Alternatively, the lamps may be actively cooled. The temperature of the absorber layer 106 and/or substrate 102 is subsequently reduced to a suitable level, e.g., by further reducing or shutting off the supply of heat from the heating unit 110. Optionally, the total heating time may be in the range of about 1 minute and about 15 minutes, between about 1 and about 30 minutes.

In some embodiments of the invention, group VIA elements such as selenium or sulfur may be incorporated into the absorber layer either before, during, or after the annealing stage. Alternatively, two or more discrete or continuous annealing stages can be sequentially carried out, in which group VIA elements such as selenium or sulfur are incorporated in a second or latter stage. The first annealing stage may be in a non-reactive atmosphere and the second or later stage may be in a reactive atmosphere. Some may include more than one VIA atmosphere(s) in sequential stages. Some of the VIA atmospheres may be separated by stages with inert or other non-VIA atmospheres. For example, the nascent absorber layer 106 may be exposed to H$_2$Se gas, H$_2$S gas, S, and/or Se vapor before, during, or after flash heating or rapid thermal processing (RTP). Any of the foregoing may be used with a carrier gas such as but not limited to an inert gas, to assist with transport. In this embodiment, the relative brevity of exposure allows the aluminum substrate to better withstand the presence of these gases and vapors, especially at high heat levels.

Once the nascent absorber layer 106 has been annealed additional layers may be formed to complete the device 100. For example a window layer is typically used as a junction partner for the absorber layer. By way of example, the junction partner layer may include cadmium sulfide (CdS), indium sulfide (In2S3), zinc sulfide (ZnS), or zinc selenide (ZnSe) or some combination of two or more of these. Layers of these materials may be deposited, e.g., by chemical bath deposition, chemical surface deposition, or spray pyrolysis, to a thickness of about 50 nm to about 100 nm. In addition, a transparent electrode, e.g., a conductive oxide layer, may be formed on the window layer by sputtering, vapor deposition, CVD, ALD, electrochemical atomic layer epitaxy and the like.

Embodiments of the present invention overcome the disadvantages associated with the prior art by rapid thermal processing of nascent CIGS absorber layers deposited or otherwise formed on aluminum substrates. Aluminum substrates are much cheaper and more lightweight than conventional substrates. Thus, solar cells based on aluminum substrates can have a lower cost per watt for electricity generated and a far shorter energy payback period when compared to conventional silicon-based solar cells. Furthermore aluminum substrates allow for a flexible form factor that permits both high-throughput roll-to-roll printing during solar cell fabrication and faster and easier installation processes during solar module and system installation.

Embodiments of the present invention allow the fabrication of lightweight and inexpensive photovoltaic devices on aluminum substrates. Flash heating/rapid thermal processing of the nascent absorber layer 106 allows for proper annealing and incorporation of group VIA elements without damaging or destroying the aluminum foil substrate 102. The plateau temperature range is sufficiently below the melting point of aluminum (about 660° C.) to avoid damaging or destroying the aluminum foil substrate. The use of aluminum foil substrates can greatly reduce the materials cost of photovoltaic devices, e.g., solar cells, made on such substrates thereby reducing the cost per watt. Economies of scale may be achieved by processing the aluminum foil substrate in a roll-to-roll fashion, with the various layers of the photovoltaic devices being built up on the substrate as it passes through a series of deposition annealing and other processing stages.

While the above is a complete description of the preferred embodiment of the present invention, it is possible to use various alternatives, modifications and equivalents. For example, those of skill in the art will recognize that any of the embodiments of the present invention can be applied to almost any type of solar cell material and/or architecture. Although the present invention primarily discusses CIGS absorber layer, the foil substrate may be used with absorber layers that include silicon, amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, Cu(In,Ga)(S,Se)2, Cu(In,Ga,Al)(S,Se,Te)2, and/or combinations of the above, where the active materials are present in any of several forms including but not limited to bulk materials, micro-particles, nano-particles, or quantum dots. The CIGS cells may be formed by vacuum or non-vacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or C60 molecules, and/or other small molecules, micro-crystalline silicon cell architecture, randomly placed nanorods and/or tetrapods of inorganic materials dispersed in an organic matrix, quantum dot-based cells, or combinations of the above. Many of these types of cells can be fabricated on flexible substrates.

Furthermore, depending on the material of the substrate 102, it may be useful to coat a surface of the substrate 102 with a contact layer 104 to promote electrical contact between the substrate 102 and the absorber layer that is to be formed on it, and/or to limit reactivity of the substrate 102 in subsequent steps, and/or to promote higher quality absorber growth. As a non-limiting example, when the substrate 102 is made of aluminum, the contact layer 104 may be but is not limited to a single or multiple layer(s) of molybdenum (Mo), tungsten (W), tantalum (Ta), binary and/or multinary alloys of Mo, W, and/or Ta, with or without the incorporation of a group IA element such as but not limited to sodium, and/or oxygen, and/or nitrogen.

For any of the embodiments herein, the layer may include a continuous layer or optionally a discontinuous layer having, in particular, patterns (either by etching of a continuous layer or by direct deposition of the discontinuous layer with the desired pattern, or by a mask system for example). This applies to any of the layers involved in the present application.

Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method comprising:
continuous processing of an elongate flexible metal substrate coated with a nascent absorber layer, the continuous processing occurring as the substrate passes through an elongate furnace in a non-oxygen group VIA vapor atmosphere in a non-vacuum process to incorporate the group VIA element into the nascent absorber layer without damaging or destroying the metal substrate and without generating substantial hydrogen selenide, wherein the elongate flexible metal substrate comprises a bulk portion comprised of aluminum and a first, electrically conductive diffusion barrier on a top surface of the aluminum and a second diffusion barrier layer on a bottom surface of the substrate, wherein the first diffusion barrier layer is between the substrate and an electrode layer.

2. The method of claim 1 wherein the nascent absorber layer and/or substrate passing through the elongate furnace is: a) rapidly heated from an ambient temperature to a plateau temperature range of between about 200° C. and about 600° C., the rapid thermal heating occurring at a ramp rate between about 5° C./sec and about 150° C./sec, b) maintained at the plateau temperature for between about 2 minutes and 10 minutes; and c) lowered to a reduced temperature.

3. The method of claim 1 wherein processing the nascent absorber layer includes depositing the nascent absorber layer from a solution of nanoparticulate precursor materials.

4. The method of claim 3 further comprising, incorporating one or more group VIA elements into the nascent absorber layer either before or during the step of rapidly heating the nascent absorber layer and/or substrate.

5. The method of claim 4 wherein the group VIA vapor atmosphere includes sulfur.

6. The method of claim 3 wherein rapidly heating the nascent absorber layer and/or substrate is performed by radiant heating of the nascent absorber layer and/or substrate.

7. The method of claim 6 wherein one or more infrared lamps apply the radiant heating.

8. The method of claim 3 wherein the continuous processing of the nascent absorber layer takes place as the substrate passes through roll-to-roll processing.

9. The method of claim 3 further comprising, incorporating one or more group VIA elements into the nascent absorber layer after rapidly heating the nascent absorber layer and/or substrate.

10. The method of claim 3, further comprising, incorporating an intermediate layer between a layer of molybdenum and the metal substrate, wherein the intermediate layer inhibits inter-diffusion of molybdenum and metal during heating.

11. The method of claim 10 wherein, the intermediate layer includes, chromium, vanadium, tungsten, glass, and/or nitrides, tantalum nitride, tungsten nitride, and silicon nitride, oxides, or carbides.

12. The method of claim 4 wherein the group VIA vapor atmosphere includes selenium.

13. The method of claim 1 wherein processing the nascent absorber layer includes depositing a film of an ink containing elements of groups IB and IIIA on the substrate.

14. The method of claim 1, further comprising disposing a layer of molybdenum between the metal substrate and the nascent absorber layer.

15. The method of claim 1 wherein the elongate furnace comprises a tube furnace.

16. A method comprising:

continuous processing of an elongate flexible metal substrate coated with a nascent absorber layer in two or more processing stages, the processing occurring as the substrate passes through an elongate furnace, wherein at least one of the foregoing stages occurs in a non-oxygen group VIA vapor in a non-vacuum process and a total time spent above ambient temperature in such vapor is sufficient to incorporate the non-oxygen group VIA material into the absorber layer without damaging or destroying the metal substrate while continuously moving the substrate through the furnace, wherein the elongate flexible metal substrate comprises a bulk portion comprised of aluminum and a first electrically conductive diffusion barrier on a top surface of the aluminum and a second diffusion barrier layer on a bottom surface of the substrate, wherein the first diffusion barrier layer is between the substrate and an electrode layer.

17. The method of claim 16 wherein the nascent absorber layer and/or substrate passing through the elongate furnace is at one stage rapidly heated from an ambient temperature to a plateau temperature range of between about 200° C. and about 600° C., the rapid thermal heating occurring at a ramp rate between about 5° C./sec and about 150° C./sec, at another stage maintained at the plateau temperature for between about 2 minutes and 10 minutes; and at yet another stage lowered to a reduced temperature.

18. The method of claim 17 wherein the substrate is moved using a roll-to-roll system.

* * * * *